(12) United States Patent
Palmisano et al.

(10) Patent No.: US 6,278,329 B1
(45) Date of Patent: Aug. 21, 2001

(54) LOW-NOISE AMPLIFIER STAGE WITH MATCHING NETWORK

(75) Inventors: Giuseppe Palmisano, Tremestieri Etneo; Giuseppe Ferla, Catania; Giovanni Girlando, Gela, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/466,573

(22) Filed: Dec. 21, 1999

(30) Foreign Application Priority Data

Dec. 22, 1998 (EP) .................................................. 98830772

(51) Int. Cl.[7] .............................. H03F 3/04; H03F 3/191
(52) U.S. Cl. ........................ 330/302; 330/306; 330/311
(58) Field of Search ................................... 330/302, 306, 330/311

(56) References Cited

U.S. PATENT DOCUMENTS

| 4,118,731 | 10/1978 | Hinn | 358/65 |
|---|---|---|---|
| 5,406,226 | * 4/1995 | Cioffi et al. | 330/306 |
| 5,532,647 | * 7/1996 | Kawakami | 330/302 |
| 5,661,438 | * 8/1997 | Saschi | 330/306 |
| 5,942,943 | * 8/1999 | Matsuno | 330/302 |

FOREIGN PATENT DOCUMENTS

| 0 833 442 A1 | 4/1998 | (EP) . | |
| 2605817 | * 4/1988 | (FR) | 330/306 |

* cited by examiner

*Primary Examiner*—Michael B Shingleton
(74) *Attorney, Agent, or Firm*—Theodore E. Galanthay; E. Russell Tarleton; Seed IP Law Group PLLC

(57) ABSTRACT

An amplifier stage having a first and a second transistor connected in series to each other between a first and a second reference potential line. The first transistor has a control terminal connected to an input of the amplifier stage through a first inductor, a first terminal connected to the second reference potential line through a second inductor, and a third terminal connected to a first terminal of the second transistor. The second transistor has a second terminal forming an output of the amplifier stage, and connected to the first reference potential line through a load resistor. To improve the noise figure, a matching capacitor is connected between the control terminal and the first terminal of the first transistor.

15 Claims, 3 Drawing Sheets

| PROCESS PARAMETERS | |
| --- | --- |
| $f_T$ | 18 GHz |
| $\beta$ | 80 |
| $r_b$ | 11.7 Ω |
| $r_e$ | 1.2 Ω |
| DESIGN PARAMETERS | | |
| | LNA Fig. 1 | LNA Fig. 3 |
| $V_{CC}$ | 2 V | 2 V |
| $I_C$ | 3.6 mA | 3.6 mA |
| $R_S$ | 50 Ω | 50 Ω |
| $R_C$ | 200 Ω | 200 Ω |
| $C_{BE}$ | 0 | 1.5 pF |
| $L_B$ | 22 nH | 11 nH |
| $L_E$ | 0.2 nH | 1.15 nH |

Fig. 5a

| CONTRIBUTIONS TO THE NOISE FIGURE | | |
| --- | --- | --- |
| SOURCE OF NOISE | LNA Fig. 1 | LNA Fig. 3 |
| $S_{VRs}$ | 1 | 1 |
| $S_{Vb}$ | 0.209 | 0.102 |
| $S_{Ve}$ | 0.020 | 0.010 |
| $S_{Ib}$ | 0.320 | 0.134 |
| $S_{Ic}$ | 0.044 | 0.071 |
| $S_{IRc}$ | 0.006 | 0.023 |
| $F_{TOT}$ (dB) | 2.28 | 1.44 |

Fig. 5b

& # x 2 0; 
LOW-NOISE AMPLIFIER STAGE WITH MATCHING NETWORK

TECHNICAL FIELD

The present invention relates to a low-noise RF (radio frequency) amplifier stage with matching network.

BACKGROUND OF THE INVENTION

As known, a high-performance unit in modern transceivers is formed by an RF (radio frequency) LNA (Low Noise Amplifier), located in the receiver chain, immediately after the antenna, or in cascade to the RF band-pass filter, connected to the antenna.

In a low-noise amplifier for the above application, the most critical parameters are noise figure F (defined as 10Log(SNR$_{in}$/SNR$_{out}$), wherein SNR$_{in}$ and SNR$_{out}$ are, respectively, the input and output signal to noise ratio), and linearity. In fact, the amplifier operates on high dynamic signals having minimum levels, in many cases lower than −100 dBm. Other important parameters of an LNA are gain and input matching, whereas output matching is usually less critical, or is not required at all, since, in a monolithic transceiver, the low-noise amplifier is disposed a few tens of μum away from the mixer, connected to the LNA output.

Matching at the input requires particular care, not only to obtain a low VSWR (Voltage Standing Wave Ratio), but above all because, as is well known, the noise figure F is strongly dependent on the matching network, arranged between the source (antenna) and the LNA itself. Therefore, the present trend is to design the matching,u network simultaneously with the low-noise amplifier, such as to obtain optimum design of the entire amplifier stage.

The more commonly used low-noise amplifier configuration with matching network is shown in FIG. 1 and is described hereinafter. The low-noise amplifier stage 1 comprises a first and a second transistor 2, 3 of NPN type, connected between a first supply line 4 set to V$_{cc}$, and a second supply line 5 set to V$_{EE}$. In detail, the first transistor 2 has a base terminal 10 connected to an input terminal 11 through a first inductor 12; an emitter terminal 15 connected to the second supply line 5 through a second inductor 16; and a collector terminal 17 connected to the emitter terminal of the second bipolar transistor 3. The latter has a base terminal 20 biased to a constant voltage V$_B$, and a collector terminal (forming an output terminal 21 of the amplifier stage 1) connected to the first supply line 4 through a load resistor 22.

An input voltage V$_i$ is supplied to the input terminal 11, and an output voltage V$_o$ is present at the output terminal 21.

In the circuit of FIG. 1, the inductors 16 and 12 form the matching network, and are used to guarantee matching, respectively of the real part and of the imaginary part of the input impedance (impedance of the amplifier stage 1, seen from input terminal 11).

The circuit in FIG. 1 has a small signal model shown in FIG. 2. wherein the various noise sources are represented by voltage or current sources.

In detail, FIG. 2 shows a generator noise voltage source 25, representing the noise associated with the signal generator (the antenna, in this specific application), and the respective resistance R$_S$ (resistor of the source 26), in series with the first inductor 12; in turn, the latter (which has inductance L$_B$) is connected in series with a base resistor 27, representing the base resistance of the first transistor 2, and with a pair of voltage sources 28 and 29, representing the thermal noise S$_{Vb}$ and S$_{Ve}$ associated respectively with the base resistance and with the emitter resistance (brought back to the input) of the first transistor 2.

The terminal of the emitter noise voltage source 29 not connected to the base noise voltage source 28 forms a node 30; between the node 30 and the node 31 are arranged, in parallel with one another, a base noise current source 32, representing the shot noise S$_{Ib}$ associated with the base region of the first transistor 2; a first capacitor 33, representing the capacitance C$_\pi$ between the base region and the emitter region; and an input resistor 34, representing the input small signal resistance r$_\pi$. A second capacitor 35, representing the base-collector capacitance C$_\mu$, is connected between node 30 and collector terminal 17; between the collector terminal 17 and a node 31, are connected, in parallel with one another, a gain current source 36, substantially representing the collector current of the first transistor 2, equivalent to g$_m$V$_{be}$, wherein g$_m$ is the transconductance of the first transistor 2, and V$_{be}$ is the voltage drop between nodes 30 and 31. and a first collector noise current source 37, representing the shot noise S$_{Ic}$ associated with the collector region of first transistor 2.

Collector terminal 17 is connected to output node 21 through a uniform gain current buffer 40, representing the second transistor 3; in addition, a load noise current source 41 is connected between node 21 and ground line and represents thermal noise S$_{IRc}$ associated with load resistor 22.

In FIG. 2, an emitter resistor 38 is connected between node 31 and emitter terminal 15, and represents the resistance r$_e$ of the emitter region.

Using the model in FIG. 2, on the assumption that:

$$\left(\frac{\omega \cdot \beta}{\omega_T}\right) \gg 1$$

wherein β is the current gain of first transistor 2, and ω$_T$ is the cut-off frequency of the transistor, defined as g$_m$/(C$_\mu$+C$_\pi$). The conductance Y$_\pi$ provided by the parallel connection of first capacitor 33 and input resistor 34 is provided by:

$$Y_\pi = j\omega \cdot C_\pi + \frac{1}{r_\pi} \approx j\omega \cdot C_\pi \qquad (1)$$

and, since resistance r$_e$ is not known (resistor 38), input impedance Z$_{in}$ (impedance of the amplifier stage 1 seen from the input terminal 11), is provided by:

$$Z_{in}(j\omega) \cong \omega_T \cdot L_E + r_b - j\frac{1}{\omega \cdot (C_\pi + C_\mu)} + j\omega \cdot (L_B + L_E) \qquad (2)$$

In the circuit in FIG. 1, the matching condition for the input impedance Z$_{in}$(jω)=R$_s$ requires selection of values for L$_B$ and L$_E$ which satisfy the following equations:

$$\omega_T \cdot L_E + r_b \cong R_S \qquad (3)$$

$$\omega^2 \cdot (L_B + L_E) \cdot (C_\pi + C_\mu) \cong 1 \qquad (4)$$

In the model of FIG. 2, the second transistor 3 has been considered as an ideal current buffer, free from noise. In this hypothesis, and in the conditions of matching according to (3) and (4), the noise factor NF, equivalent to SNR$_{in}$/SNR$_{out}$, is provided by:

$$NF \approx 1 + \frac{r_b + r_e}{R_S} + \frac{1}{2} \cdot g_m \cdot R_S \cdot \left(1 + \frac{r_b}{R_S}\right)^2 \cdot \left[\frac{1}{\beta} + \left(\frac{\omega}{\omega_T}\right)^2\right] + \quad (5)$$

$$\frac{1}{2 \cdot \beta \cdot g_m \cdot R_S} \cdot \left(\frac{\omega_T}{\omega}\right)^2 + \frac{R_S}{R_C} \cdot \left(\frac{\omega}{\omega_T}\right)^2$$

wherein the inductors 12, 16 have been considered ideal. The contribution of the real inductors can be calculated by connecting resistors in series to the base resistor 27 and emitter resistor 38.

SUMMARY OF THE INVENTION

A low-noise amplifier stage with a matching network with improved noise figure is provided.

The disclosed embodiments of the invention are directed to an amplifier stage having a first and a second transistor element connected in series to each other between a first and a second reference potential line, the first transistor having a control terminal connected to an input of the amplifier stage through a first inductive elements a first terminal connected to the second reference potential line through a second inductive element, and a third terminal connected to a first terminal of the second transistor element; the second transistor element having a second terminal forming an output of the amplifier stage and connected to the first reference potential line through a lode element; and a capacitive element connected between the control terminal and the first terminal of the first transistor element.

BRIEF DESCRIPTION OF THE DRAWINGS

To facilitate understanding of the present invention, a preferred embodiment is now described, purely by way of non-limiting example, with reference to the attached drawings, wherein:

FIGS. 5a and 5b show tables concerning simulations carried out for the amplifier stages of FIGS. 1 and 3.

DETAILED DESCRIPTION OF THE INVENTION

Figure 1:
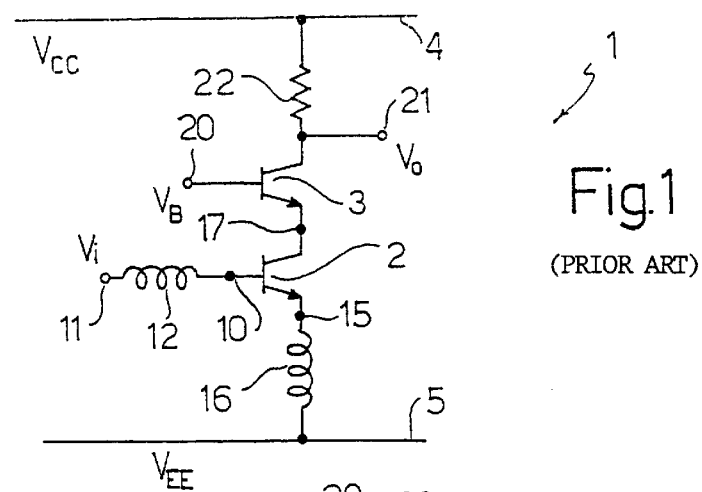
FIG. 1 shows the circuit diagram of a low-noise amplifier stage of known type.
Figure 3:
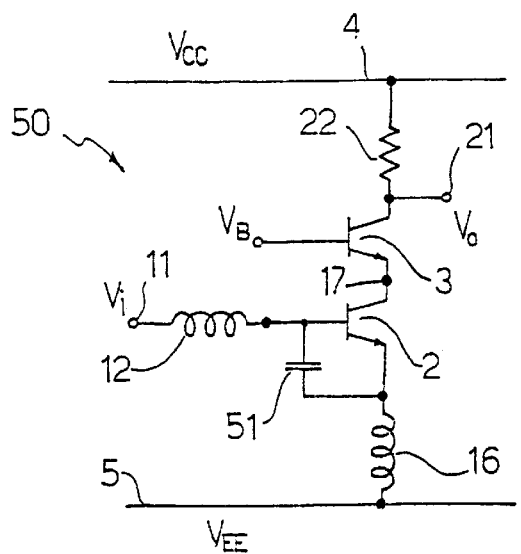
FIG. 3 shows the circuit diagram of a low-noise amplifier stage according to the invention.

Referring to FIG. 3, shown therein is an amplifier stage 50. The components of the amplifier stage 50 common to the amplifier stage 1 of FIG. 1 are designated with the same reference number, and are not described again.

Figure 2:
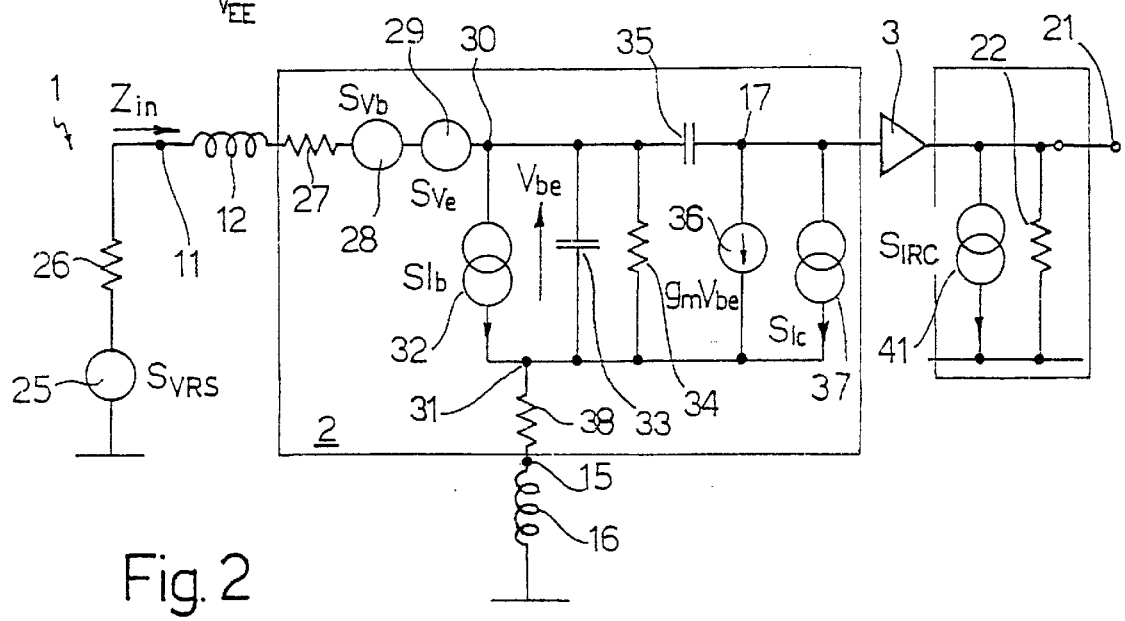
FIG. 2 shows the small signal equivalent circuit for the amplifier stage of FIG. 1.

As shown in FIG. 3, a matching capacitor 51 is connected between the base terminal 10 and the emitter terminal 15 of the first transistor 2. The matching capacitor 51, having a capacitance $C_{BE}$, is approximately in parallel with the first capacitor 33 in the equivalent diagram of FIG. 2. Consequently, this reduces the value of $\omega_T$ by a factor K, since:

$$K = \frac{C_\pi + C_\mu}{C_\pi + C_\mu + C_{BE}} \quad (6)$$

Figure 4:
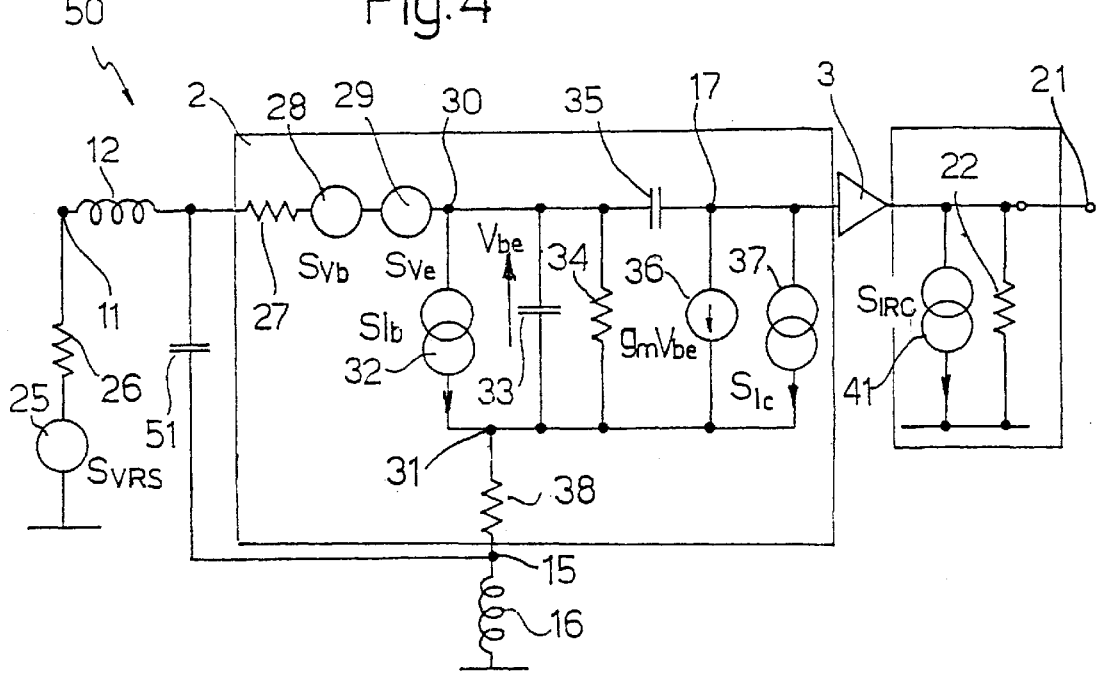
FIG. 4 shows the small signal equivalent circuit for the amplifier stage of FIG. 3.

The amplifier stage 50 of FIG. 3 has the small signal model shown in FIG. 4. In this case it can be proved that:

$$Z_{in}(j\omega) \cong K \cdot \omega_T \cdot L_E - j\frac{1}{\omega \cdot (C_\pi + C_{BE} + C_\mu)} + j\omega \cdot (L_B + L_E) \quad (7)$$

and the matching conditions become:

$$K \cdot \omega_T \cdot L_E \cong R_S \quad (8)$$

$$\omega^2 \cdot (L_B + L_E) \cdot (C_\pi + C_{BE} + C\mu) \cong 1 \quad (9)$$

Thus, to satisfy the conditions of (7), it is therefore necessary to increase the value $L_E$ of the second inductance 16, compared with the value obtained from (3), whereas to satisfy the conditions of (9), it is necessary to reduce the value $L_B$ of the first inductance 12, compared with the value obtained from (4).

In the conditions provided by (8) and (9), the noise factor NF' becomes:

$$NF \approx 1 + \frac{r_b + r_e}{R_S} \cdot \left\{ K^2 + \left[g_m \cdot R_S \cdot \left(\frac{1}{K} - 1\right) \cdot \left(\frac{\omega}{\omega_T}\right)\right]^2 \right\} + \quad (10)$$

$$\frac{1}{2} \cdot g_m \cdot R_S \cdot \left[\frac{1}{\beta} + \left(\frac{\omega}{K \cdot \omega_T}\right)^2\right] +$$

$$\frac{1}{2 \cdot \beta \cdot g_m \cdot R_S} \cdot \left(\frac{K \cdot \omega_T}{\omega}\right)^2 + 4 \cdot \frac{R_S}{R_C} \cdot \left(\frac{\omega}{K \cdot \omega_T}\right)^2$$

For comparing the characteristics of the present amplifier stage 50 with those of the known amplifier of FIG. 1, simulations were carried out at an operating frequency of 900 MHz, using a process having the parameters shown in the upper part of the table of FIG. 5a; on the other hand the design parameters of the two circuits are contained in the columns at the bottom of the same table of FIG. 5a.

The table of FIG. 5b contains the noise figure contributions and the noise figure value for the amplifier stages 1 and 50 of FIGS. 1 and 3.

The matching capacitor 51 causes a reduction in the dominant noise contributions caused by noise $S_{vb}$ of the base noise voltage source 28, and the noise $S_{Ib}$ of the base noise current source 32 for more than one factor 2, whereas it causes an increase in less significant contributions (noise $S_{Ic}$ of the gain current source 36, and noise $S_{IRc}$ of the load noise current source 41). The overall improvement in the noise figure is equivalent to 0.84 dB.

In the case of inductors with a low merit factor such as those used in RF integrated circuits, the improvement in the noise figures associated with the inductors 12 and 16 is even more pronounced, since the noise associated with these inductors undergoes the same reduction of the contribution $S_{vb}$ of the base noise voltage source 28, and $S_{ve}$ of the emitter noise voltage source 29.

The presence of the matching capacitor 51 can in some circumstances worsen the frequency capability of the amplifier stage 50 of FIG. 3, compared with the known amplifier stage of FIG. 1. In fact, although the significant low-frequency noises $S_{vb}$ and $S_{Ib}$ have been reduced, the significant high-frequency noises $S_{Ic}$ and $S_{IRc}$ are increased. However, this frequency-noise exchange through the matching capacitor 51 is advantageous, provided that the low-frequency contributions are dominant, compared with the high-frequency contributions. This is the case for many of the present technologies for RF integrated circuits, the transition frequencies of which are higher by an order of magnitude than the typical operating frequencies.

Figure 6:
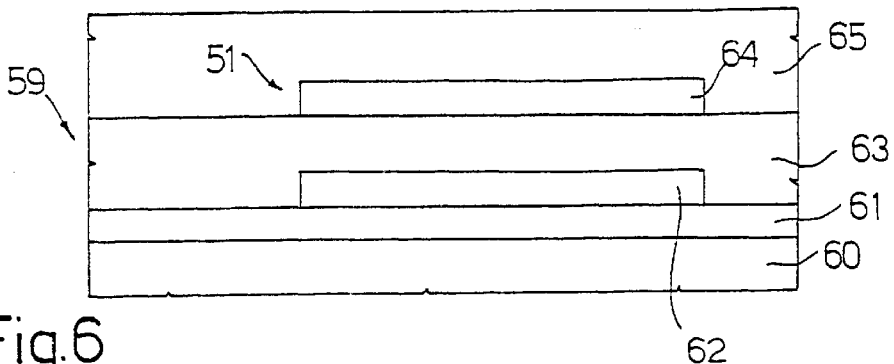
FIGS. 6 and 7 show cross-sections of a semiconductor material wafer for a component of the amplifier stage of FIG. 3, according to two different embodiments.

Matching capacitor 51 can be produced in integrated form, using two metal levels (layers). FIG. 6 shows a wafer 59 wherein the process has only two metal levels. In the illustrated example, a first dielectric layer 61 extends on a monocrystalline silicon substrate 60; a first metal region 62, belonging to the first metal level, extends above the first dielectric layer 61 and forms a first plate of matching capacitor 51; above metal region 62 and first dielectric layer 61, a second dielectric layer 63 is arranged. Above the second dielectric layer 63, a second metal region 64, belonging to the second metal level, extends in a position overlying the first metal region 62 and forms a second plate of matching capacitor 51. A protective layer 65 covers the entire wafer 59.

Figure 7:
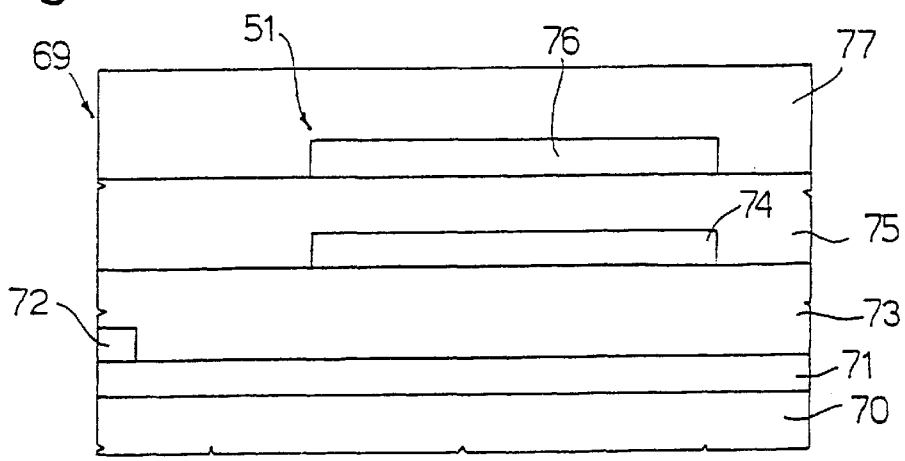

FIG. 7 shows a wafer 69 wherein the process has three metal levels. In this case, a first metal region 72, belonging to the first metal level, extends above a substrate 70 and a first dielectric layer 71 and is used for example for electrically connecting conductive regions of the amplifier stage integrated in wafer 69. In the wafer 69 a second and a third dielectric layer 73, 75, and a protection layer 77 are superimposed to each other and to the first dielectric layer 71. The matching capacitor 51 here is formed by a second and a third metal region 74, 76, interposed respectively between the second and the third dielectric layer 73, 75 and protection layer 77. The second and the third metal regions 74, 76 are superimposed to each other, and belong respectively to the second and third metal levels.

The solution of FIG. 7 has the advantage of minimizing the metal-substrate parasitic capacities; however, also in the case of a three-level metal process, it is possible to manufacture the matching capacitor 51 by using the first and the second metal level, or the first and the third metal level.

The advantages of the described amplifier stage include considerably improved noise figure through use of a circuital and implementation-simple solution. The obtained circuit is reliable, and for its production requires the use of standard techniques or machinery.

Finally, it is apparent that many modifications and variants can be made to the amplifier stage described and illustrated here, all of which come within the scope of the invention, as defined in the attached claims. For example, the matching capacitor 51 could be made of a material other than metal; for example the lower plate could be formed in the substrate, and/or of semiconductor material.

What is claimed is:

1. An amplifier stage, comprising a first and a second transistor element connected in series to each other between a first and a second reference potential line, said first transistor having a control terminal connected to an input of said amplifier stage through a first inductive element, a first terminal connected to said second reference potential line through a second inductive element, and a third terminal connected to a first terminal of said second transistor element; said second transistor element having a second terminal forming an output of said amplifier stage and connected to said first reference potential line through a load element; and a capacitive element connected between said control terminal and said first terminal of said first transistor element.

2. The amplifier stage of claim 1 wherein said capacitive element comprises two plates of metal, superimposed to each other and insulated to each other.

3. The amplifier stage of claim 2 wherein said plates are formed respectively in a second and in a third metal level.

4. The amplifier stage of claim 1 wherein said first and second transistor elements arc bipolar transistors.

5. The amplifier stage of claim 4 wherein said bipolar transistors are NPN type, said first terminal of said first and second transistor elements is an emitter terminal, said second terminal of said first and second transistor elements is a collector terminal, and said control terminal is a base terminal.

6. A low-noise radio frequency amplifier stage with matching network. comprising:

a load coupled to a first reference potential;

a first transistor having a first terminal, a second terminal, and a control terminal;

a second transistor having a first terminal coupled to the load at a first node that comprises an output terminal of the amplifier stage, a control terminal coupled to a voltage source, and a second terminal coupled to the first terminal of the first transistor;

a first inductor coupled between an input of the amplifier stage and the control terminal of the first transistor;

a second inductor coupled between the second terminal of the first transistor and a second reference potential; and a capacitor coupled between the control terminal and the second terminal of the first transistor; the capacitor, the first and second transistors, and the first and second inductors configured to provide matching conditions that reduce noise generated by an input signal in the capacitor, the first and second transistors, and the first and second inductors.

7. The amplifier stage of claim 6 wherein the matching conditions comprise input impedance matching.

8. The amplifier stage of claim 6 wherein the first transistor comprises an NPN transistor with the first, second, and third terminals comprising respectively a collector, an emitter, and a base; and the second transistor comprises an NPN transistor with the first, second, and third terminals comprising respectively a collector, an emitter, and a base.

9. The amplifier stage of claim 8 wherein the following conditions are satisfied:

$$K \cdot \omega_T \cdot L_E \cong R_S$$

and $$\omega^2 \cdot (L_B + L_E) \cdot (C_\pi + C_{BE} + C_\mu) \cong 1$$

where $C_{BE}$ is the capacitance of the capacitor, $C_\mu$ is the base-collector capacitance of the first transistor, $C_\pi$ is the base-emitter capacitance of the first transistor, $K$ is $\dfrac{C_\pi + C_\mu}{C_\pi + C_\mu + C_{BE}}$ $\omega_T$ is the cut-off frequency of the first transistor, $L_B$ is the inductance of the first inductor, $L_E$ is the inductance of the second inductor.

10. The amplifier stage of claim 9 wherein the noise meets the following conditions:

$$NF \approx 1 + \frac{r_b + r_e}{R_S} \cdot \left\{ K^2 + \left[ g_m \cdot R_S \cdot \left( \frac{1}{K} - 1 \right) \cdot \left( \frac{\omega}{\omega_T} \right) \right]^2 \right\} +$$

$$\frac{1}{2} \cdot g_m \cdot R_S \cdot \left[ \frac{1}{\beta} + \left( \frac{\omega}{K \cdot \omega_T} \right)^2 \right] +$$

$$\frac{1}{2 \cdot \beta \cdot g_m \cdot R_S} \cdot \left( \frac{K \cdot \omega_T}{\omega} \right)^2 + 4 \cdot \frac{R_S}{R_C} \cdot \left( \frac{\omega}{K \cdot \omega_T} \right)^2$$

where

NF is the noise factor, $r_b$ is the resistance of a base region of the first transistor, $r_e$ is the resistance of an emitter region of the first transistor, $R_C$ is the resistance of the load at the collector of the second transistor, $g_m$ is the transconductance of the first transistor, $\beta$ is the gain of the first transistor.

11. A method of forming a low noise radio frequency amplifier stage with matching network, the amplifier with matching network having a first transistor with a collector terminal, a base terminal, and an emitter terminal, a second transistor having a collector terminal coupled to a load that in turn is coupled to a first reference potential, the node between the collector and the load forming an output of the amplifier stage, a base coupled to a constant voltage source, and an emitter coupled to the collector of the first transistor, a first inductor coupled between the base of the first transistor and an input to the amplifier stage, a second inductor coupled between the collector of the first transistor and a second reference potential line, the method comprising:

configuring the amplifier stage to include a capacitor coupled between the base and emitter of the first transistor; and configuring the capacitor, the first and second transistors, and the first and second inductors to provide matching conditions that minimize noise generated by an input signal and by the capacitor, the first and second inductors, and the first and second transistors.

12. The method of claim 11 wherein providing matching conditions comprises providing matching conditions of input impedance matching.

13. The method of claim 11, further comprising configuring the amplifier stage to use NPN transistors for the first and second transistors.

14. The method of claim 13 wherein the following conditions are satisfied:

$$K \cdot \omega_T \cdot L_E \cong R_S$$

and $$\omega^2 \cdot (L_B + L_E) \cdot (C_\pi + C_{BE} + C_\mu) \cong 1$$

where $C_{BE}$ is the capacitance of the capacitor, $C_\mu$ is the base-collector capacitance of the first transistor, $C_\pi$ is the base-emitter capacitance of the first transistor, $K$ is $\frac{C_\pi + C_\mu}{C_\pi + C_\mu + C_{BE}}$ $\omega_T$ is the cut-off frequency of the first transistor, $L_B$ is the inductance of the first inductor, $L_E$ is the inductance of the second inductor.

15. The method of claim 14 wherein the capacitor, the first and second inductors, and the first and second transistors are configured to provide the following noise factor:

$$NF \approx 1 + \frac{r_b + r_e}{R_S} \cdot \left\{ K^2 + \left[ g_m \cdot R_S \cdot \left( \frac{1}{K} - 1 \right) \cdot \left( \frac{\omega}{\omega_T} \right) \right]^2 \right\} +$$

$$\frac{1}{2} \cdot g_m \cdot R_S \cdot \left[ \frac{1}{\beta} + \left( \frac{\omega}{K \cdot \omega_T} \right)^2 \right] +$$

$$\frac{1}{2 \cdot \beta \cdot g_m \cdot R_S} \cdot \left( \frac{K \cdot \omega_T}{\omega} \right)^2 + 4 \cdot \frac{R_S}{R_C} \cdot \left( \frac{\omega}{K \cdot \omega_T} \right)^2$$

where

NF is the noise factor, $r_b$ is the resistance of a base region of the first transistor, $r_e$ is the resistance of an emitter region of the first transistor, $R_C$ is the resistance of the load at the collector of the second transistor, $g_m$ is the transconductance of the first transistor, $\beta$ is the gain of the first transistor.

* * * * *